United States Patent
Klieger et al.

(10) Patent No.: US 7,239,142 B2
(45) Date of Patent: Jul. 3, 2007

(54) COIL ARRANGEMENT FOR MAGNETIC RESONANCE IMAGING APPARATUS

(75) Inventors: Michael Robert Klieger, New York, NY (US); Ray F. Lee, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 11/447,324

(22) Filed: Jun. 5, 2006

(65) Prior Publication Data

US 2006/0273798 A1 Dec. 7, 2006

Related U.S. Application Data

(60) Provisional application No. 60/687,194, filed on Jun. 3, 2005.

(51) Int. Cl.
*G01V 3/00* (2006.01)
(52) U.S. Cl. ........................................... 324/318
(58) Field of Classification Search ................ 324/318
See application file for complete search history.

(56) References Cited

U.S. PATENT DOCUMENTS

| | | | |
|---|---|---|---|
| 4,767,993 A * | 8/1988 | Hanawa ...................... | 324/318 |
| 4,825,162 A | 4/1989 | Roemer et al. | |
| 4,996,481 A * | 2/1991 | Ackerman et al. .......... | 324/318 |
| 5,185,577 A * | 2/1993 | Minemura ................... | 324/318 |
| 5,351,688 A * | 10/1994 | Jones ........................... | 600/422 |
| 6,747,452 B1 * | 6/2004 | Jectic et al. ................. | 324/311 |
| 6,836,118 B2 * | 12/2004 | Molyneaux et al. ........ | 324/319 |
| 6,946,840 B1 * | 9/2005 | Zou et al. .................... | 324/318 |
| 2003/0094948 A1 * | 5/2003 | Okamoto et al. ........... | 324/318 |
| 2003/0122546 A1 * | 7/2003 | Leussler ...................... | 324/318 |

OTHER PUBLICATIONS

D. Spencer et al., "Design of a 32 Channel Cardiac Array for Parallel Imaging", Proc. Intl. Soc. Mag. Reson. Med. 13 (2005).
G.R. Duensing et al., "Maximizing Signal-to Noise Ratio in the Presence of Coil Coupling", Journal of Magnetic Resonance, 1996, Series B 111, pp. 230-235.
Yukinori Takagi et al., "MR Microscopy of the Parotid Glands in Patients with Sjogren's Syndrome: Quantitative MR Diagnostic Criteria" AM J Neuroradial May 26, 2005, pp. 1207-1214.

* cited by examiner

*Primary Examiner*—Brij Shrivastav
*Assistant Examiner*—Megann Vaughn
(74) *Attorney, Agent, or Firm*—Dorsey & Whitney LLP (57) ABSTRACT

A coil arrangement is provided that is configured to be used with a magnetic resonance imaging system. The arrangement can include a first coil element and a second coil element positioned adjacent to the first coil element. The second coil element may be different in size from the first coil element. The coil elements may be generally circular or rectangular in shape, or can have other shapes, and they may have different sizes from one another. In one exemplary embodiment, the coil elements overlap one another. In a further exemplary embodiment, three coil elements may be provided in an orientation such that a center coil is immediately adjacent to two outer coils, and the center coil element may be smaller than the outer coil elements. In still further exemplary embodiments, the coil elements may be configured in the form of a linear array or a two-dimensional array.

26 Claims, 6 Drawing Sheets

COIL ARRANGEMENT FOR MAGNETIC RESONANCE IMAGING APPARATUS

CROSS-REFERENCE TO RELATED APPLICATION(S)

This application claims priority from U.S. Patent Application Ser. No. 60/687,194, filed Jun. 3, 2005, the entire disclosure of which is incorporated herein by reference.

FIELD OF INVENTION

The present invention relates to the field of magnetic resonance imaging ("MRI"), and more particularly to surface coils for detecting nuclear magnetic resonance ("NMR") signals for high resolution imaging.

BACKGROUND OF THE INVENTION

MRI is a well-established imaging technique. A conventional MRI device can provide a homogenous magnetic field (conventionally referred to as B0), which may be aligned along an axis in a human body to be imaged. The magnetic field can cause nuclear spins to align, and their magnetic moments may then precess around the direction of the main magnetic field. A subsequent radiofrequency pulse (e.g., an excitation pulse) can be applied by a radio frequency ("RF") transmit coil, thereby causing the nuclear spins to absorb energy. This can perturb a magnetic moment of the nuclear spins around the axis of B0.

After the excitation pulse, the precessing magnetic moments can return to a steady state by a process referred to as free induction decay ("FID"). During FID, the absorbed energy may be released, and the NMR signals can be detected by a RF coil, which may be configured to only transmit or to both transmit and receive. The measured signal can be processed to extract additional information such as, e.g., data that may be used to generate cross-sectional images of the human body, or generation and examination of spectroscopic data. Pulse sequences can be developed and/or refined to improve the quality and type of image data. More specifically, radiofrequency pulses and field gradients can be varied to create images and/or data suitable for various clinical and research purposes.

When using MRI techniques, it can be desirable to have excitation and/or reception interactions be spatially uniform in the imaging volume. This can, e.g., provide better image uniformity. Excitation field homogeneity can be obtained by using a whole-body volume RF coil for transmission. An NMR signal generated by excited tissue can then be received either by the body coil itself, or by another coil such as, e.g., a surface coil which can be located immediately adjacent to the NMR signal region of interest. The surface coil can be configured as a "transmit only" coil or a "transmit/receive" coil. A whole body volume coil that is utilized as a receive coil may produce a lower signal-to-noise ratio ("SNR") than a local surface coil, because it may be located farther from the signal-generating target. Surface coils can also reduce noise contributions from electrical losses in the object being imaged, which can result in a higher SNR as compared to a remote coil. This can result in an improved image quality or data acquisition.

A high SNR can be achieved for a region being imaged by using a surface coil element having a diameter, D, which is approximately equal to the distance from the coil to the region being imaged. The region of tissue being imaged can often be located directly below a surface coil at approximate depth ("DP") from the coil itself. As the diameter of a surface coil element is decreased, the corresponding SNR generated using the coil element may increase, which can provide better image or data quality. A field-of-view ("FOV") that can be obtained using the surfaced coil may decrease with a decreasing coil element size. The size of a surface coil can thus be selected to provide a compromise between improved resolution and a larger field-of-view.

Two or more coil elements may be combined in a surface coil to increase the effective FOV. A surface coil having more than one conductive element and that is configured to minimize or reduce mutual inductance between the elements may be referred to as a phased array coil or a multi-channel phased array coil. A phased array coil can maintain a high SNR associated with individual coil elements, while enlarging the overall FOV and minimizing or reducing noise and/or artifacts in the image data obtained. However, a mutual inductance between the coil elements can cause a decrease in the frequencies detected and/or resolved, and may degrade the SNR associated with the involved loops.

A phased array arrangement configured to combine signals from an array of smaller coils to obtain a higher SNR than may be achieved using a single large diameter loop coil with the same FOV is described, e.g., in U.S. Pat. No. 4,825,162 to Roemer et al. ("Roemer"). Roemer describes certain techniques for decoupling both adjacent and non-adjacent coil elements. The adjacent coil elements can partially overlap in certain arrangements to eliminate a mutual impedance within these coil elements (e.g., "next-to interactions"). Mutual impedance in non-adjacent elements (e.g., "next-to-nearest interactions") within a plurality of coil elements can be reduced or eliminated by, e.g., connecting individual elements to preamplifier units which may have a low impedance, but which may have a high impedance with respect to individual elements. This decoupling can reduce or prevent current flow in an antenna in response to an induced voltage. The magnetic field associated with such a current could induce signals in a neighboring antenna in the absence of such decoupling.

OBJECTS AND SUMMARY OF THE INVENTION

According to one exemplary embodiment of the present invention, a coil arrangement is provided that can be configured to be used with a magnetic resonance imaging system. The arrangement can include a first coil and a second coil positioned adjacent to the first coil. The second coil may be of a different size than the first coil. Each of the coils may have a generally circular shape, a rectangular in shape, and/or another shape. The coils may be different in size, e.g., they may have different radial lengths from one another, different circumferential lengths, and/or different internal areas, which may be defined by the coil perimeters. In one exemplary embodiment of the present invention, the coils may overlap one another at least partially.

In certain exemplary embodiment of the present invention, three coils can be provided in an orientation such that the center coil can be positioned immediately adjacent to the other two coils, and the other two coils may not be immediately adjacent to one another. The two outer coils may be approximately the same size. The center coil may be smaller than the outer two coils.

In further exemplary embodiments of the present invention, a plurality of coils can be provided in a linear array, in which the size of the coils along an extension of the array may alternate between a larger size and a smaller size with respect to one another. Such linear arrays of coils may also be provided in a repeating pattern of three different sizes. Adjacent coils in these linear arrays may be provided in close proximity to each other, or alternatively the adjacent coils may overlap slightly. The two outer coils may be approximately the same size. The center coil may be smaller than the outer two coils. The centers of the coils in the linear array may lie along a straight line or along a curve.

In still further exemplary embodiments of the present invention, a plurality of coils can be provided in a two-dimensional array, which may be configured as two or more adjacent rows of coils. The coils in each row may have different sizes, and may alternate between at least one larger size and at least one smaller size. The rows of coils may be arranged such that adjacent coils in different rows may also have different sizes. Further, the coils in the two-dimensional array may overlap slightly.

A magnetic resonance imaging apparatus according to exemplary embodiments of the present invention can also be provided. The apparatus can include a processor, a transmitter that can generate an excitation pulse in a coil in response to a signal from the processor, a receiver that can receive a response signal in response to the excitation pulse; and a coil arrangement. The coil arrangement can be connected to the transmitter and/or the receiver. The coil arrangement may include one or more first coils having a first size, and one or more second coils having a second size different than the first size. The second coil can be positioned adjacent to the first coil.

These and other objects, features and advantages of the present invention will become apparent upon reading the following detailed description of embodiments of the invention, when taken in conjunction with the appended claims.

BRIEF DESCRIPTION OF THE DRAWINGS

Further objects, features and advantages of the invention will become apparent from the following detailed description taken in conjunction with the accompanying figures showing illustrative embodiments of the invention, in which.

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments.

DETAILED DESCRIPTION OF EXEMPLARY EMBODIMENTS OF INVENTION

Figure 1:
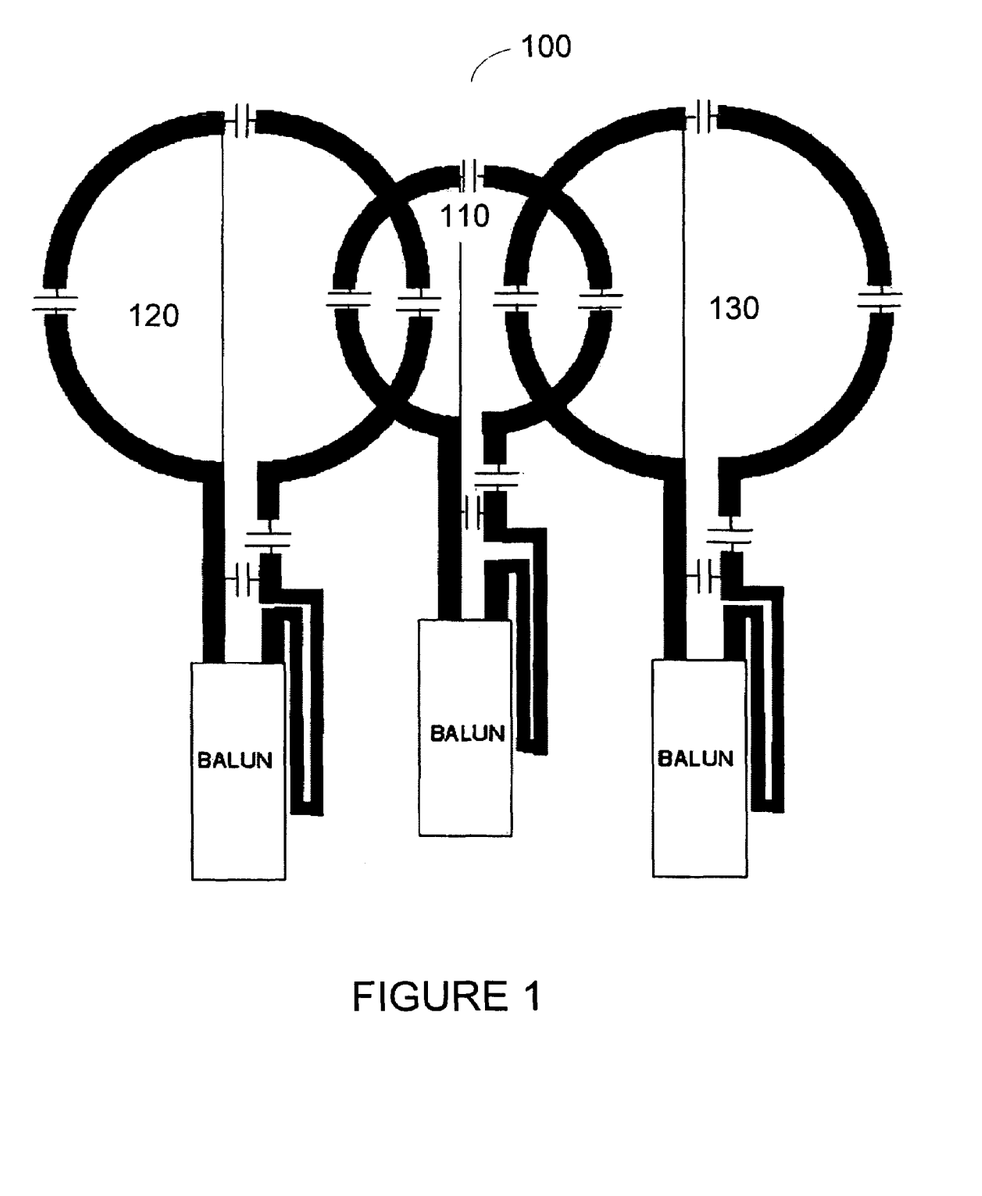
FIG. 1 is a schematic diagram of an arrangement of three coils in accordance with an exemplary embodiment of the present invention.

FIG. 1 shows a schematic view of a coil arrangement 100 of three coils D1, D2, D3 in accordance with an exemplary embodiment of the present invention. The coil arrangement can improve an effective SNR and/or achieve decoupling of non-adjacent coil elements without using a preamplifier. For example, at least one element can have a diameter that is different than the diameter of at least one of the adjacent coil elements. The coils D1, D2, D3 may be used in a phased array in connection with an MRI device, to transmit RF excitation pulses and/or to receive NMR response signals. The design and configuration of the phased array coils can be improved by varying the diameter of a central element in relation to one or more immediately adjacent elements. The coil diameters can be selected to achieve a larger SNR for a given target of interest and/or to achieve effective decoupling of next-to-nearest mutual induction interactions between non-adjacent elements without using a preamplifier In the exemplary coil arrangement 100 shown in FIG. 1, one coil 110 is smaller than the immediately adjacent coils 120, 130. The diameters of the coil elements 120, 130 immediately adjacent to the central coil element 100 may be selected to decouple these coils relative to each other and/or to decouple them from other coil elements that are not immediately-adjacent to each other.

In a further exemplary embodiment in accordance with the present invention, the coils 110, 120, 130 may be substantially circular, and the outer coils 120, 130 may have substantially the same size and shape as each other, where both of the outer coils may be larger than the central coil 100. The arrangement 100 shown in FIG. 1 can be particularly sized, e.g., for imaging the inner ear. Such arrangement 100 may be referred to herein as a "cochlear" coil arrangement. In one exemplary embodiment in accordance with the present invention, the coils 110, 120, 130 can have diameters of, e.g., 5 cm, 7 cm, and 7 cm, respectively. In other exemplary embodiments, the coils 110, 120, 130 may have different shapes and/or different dimensions. In still another exemplary embodiment, three coils can be used, and the center coil (e.g., coil 110 in FIG. 1) can have a diameter that is approximately equal to a physical distance from the coil to a target of interest.

The coil arrangement 100 according to exemplary embodiments of the present invention may be used in conjunction with conventional MRI techniques and systems. For example, a coil arrangement may be capable of decoupling coil elements that are not immediately adjacent to one another, without using a preamplifier, by providing a further coil element located between these two non-adjacent coil elements. This further coil element may have a size that is different that the size of the non-adjacent coil elements. The SNR of the coil arrangement may be improved by changing the diameter of the coil element in relation to the adjacent coil elements. This modification of the arrangement may be utilized independently of other features of exemplary embodiments of the present invention. In the coil arrangement 100 shown in FIG. 1, the coils 110, 120, 130 overlap each other, which can allow adjacent coils to be decoupled.

The coils 110, 120, 130 may also be positioned adjacent to one another without overlapping. The coils 110, 120, 130 shown in FIG. 1 may be connected to balance/unbalanced connection devices (baluns) 140.

Figure 2:
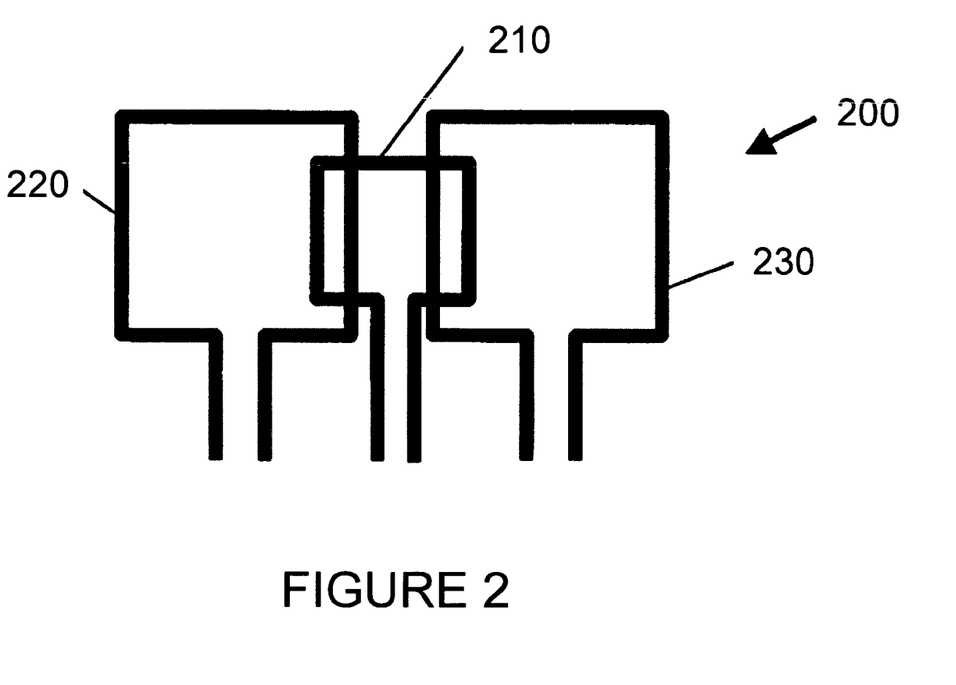
FIG. 2 is a schematic diagram of a coil arrangement that includes three rectangular coils positioned adjacent one another in an overlapping orientation.

FIG. 2 shows another exemplary embodiment of a coil arrangement 200 according to exemplary embodiments of the present invention. Three rectangular coils 210, 220, 230 may be positioned adjacent each other, and in an overlapping orientation. The second coil 210 can have a different size than the first and third coils 220, 230. For example, the first and third coils 220, 230 may have substantially the same or a similar size and shape, and the second coil 210 may be positioned between the first and third coils 220, 230, and it may be smaller than the first and third coils 220, 230.

Figure 3:
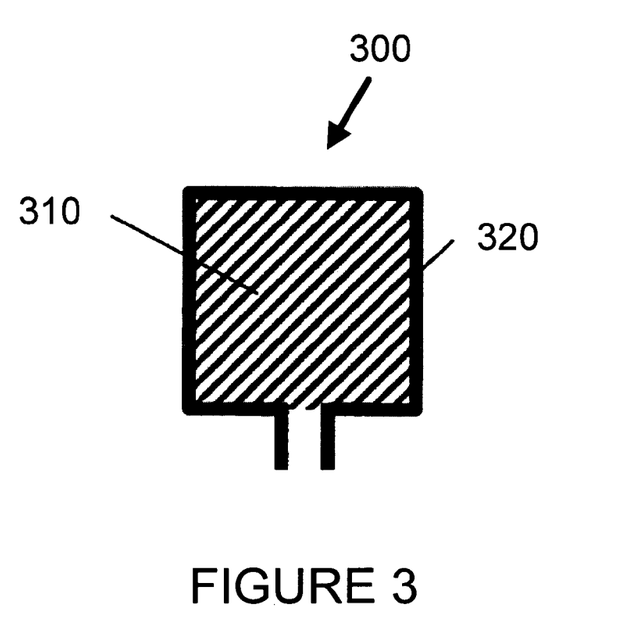
FIG. 3 is a detailed view of one of the coils shown in FIG. 2.

The size of the individual coils can be characterized in several ways. For example, each coil can define an interior area. FIG. 3 shows an exemplary coil 300 which can define an interior area 310 indicated by the shaded portion. In the coil arrangement 100 shown in FIG. 1, the second coil 110 can define an interior area that is smaller than the adjacent coils 120, 130. Similarly, the second coil 210 shown in FIG. 2 may define an interior area that is smaller than that defined by the adjacent coils 220, 230.

Each coil may also be characterized by a circumferential length measured along the outside perimeter of the coil surrounding the interior area. The exemplary coil 300 shown in FIG. 3 can be characterized by a circumferential length which may be defined as the total length of the dark line 320 surrounding the interior area 310. In the coil arrangement 100 shown in FIG. 1, the second coil 110 can be characterized by a circumferential length that is shorter than that of the adjacent coils 120, 130. Similarly, the second coil 210 shown in FIG. 2 may has a circumferential length that is shorter than that of the adjacent coils 220, 230.

A coil can also be characterized by a radial length. For example, circular coils 110, 120, 130 shown in FIG. 1 may have a radial length defined which can be defined as a distance measured from a center of the interior area to a point on the coil perimeter. For coils that do not have a circular shape such as, e.g., the coils 210, 220, 230 shown in FIG. 2, the radial length may be defined to be an average distance measured from the center of the interior area to the perimeter of the coil. Alternatively, a radial length may be defined as a minimum or a maximum distance from a center of the interior area to a point on the coil perimeter.

Figure 4A:
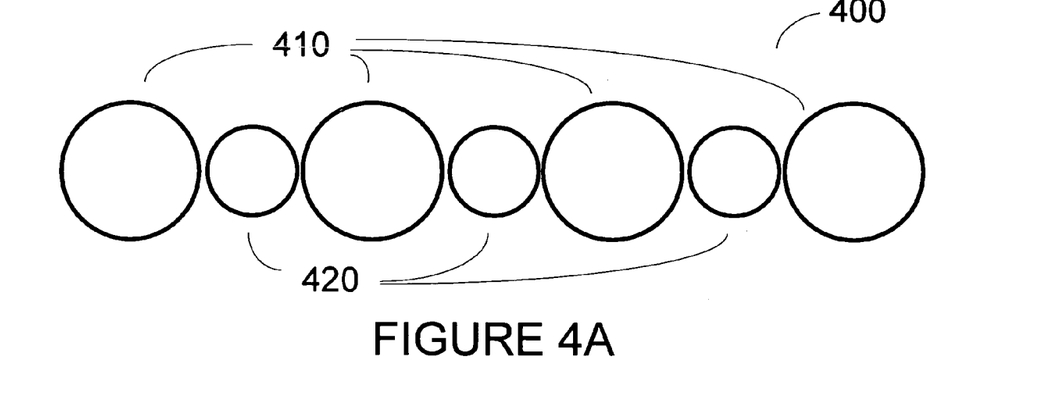
FIG. 4A is a is a schematic diagram of a linear array of coils in accordance with an exemplary embodiment of the present invention.

In further exemplary embodiments of the present invention, a plurality of coils can be provided in a linear array, where the coil sizes may be configured in a repeating pattern. The size of a coil may be characterized by an associated radial length, a circumferential length, and/or an enclosed area as described above. The size of the coils along the linear array may alternate between a larger size and a smaller size. For example, if "A" represents a coil having a larger size and "B" represents a coil having a smaller size, a linear array can be configured as ABABABA. A linear array of coils 400 that includes larger coils 410 and smaller coils 420 having this configuration is shown in FIG. 4A. In this figure, details of the exact coil structure are not shown, and each coil 410, 420 has an approximately circular shape that is represented by a solid circle. Other coil shapes may be used in the linear coil arrays such as, for example, square coils, rectangular coils, other polygonal coils, and/or ovoid-shaped coils.

Linear arrays in accordance with exemplary embodiments of the present invention may have varying numbers of coils. For example, the linear coil array 400 shown in FIG. 4A has seven coils 410, 420, and linear arrays containing more or fewer coils may also be utilized. It may be preferable to provide linear arrays containing an odd number of coils, which further provides that the coils located at each end have the same size. Linear arrays may also be provided in which the coil sizes along the array form a repeating sequence of three or more different sizes. For example, if "A" represents a coil having a large size, "B" represents a coil having a small size, and "C" represents a coil having an intermediate size, a linear sequence of the three coil sizes may be provided as, e.g., ABACABACABA. It may be preferable to provide a symmetrical sequence of coil sizes in the linear coil arrays.

Figure 4B:
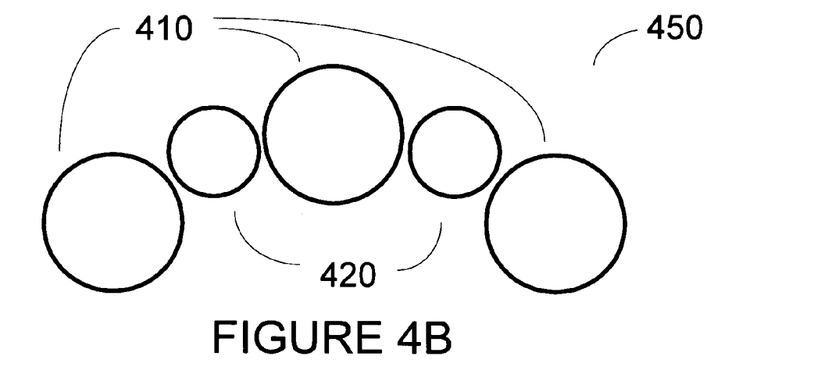
FIG. 4B is a is a schematic diagram of a linear array of coils wherein the centers of the coils lie along a curved line, in accordance with an exemplary embodiment of the present invention.

The exemplary linear arrays of coils may also be provided in a configuration where the centers of the coils lie along a curve rather than along a straight line, as shown in the linear array 450 FIG. 4B. These linear arrays that lie along a curve rather than a straight line may also contain varying numbers of coils.

Figure 4C:
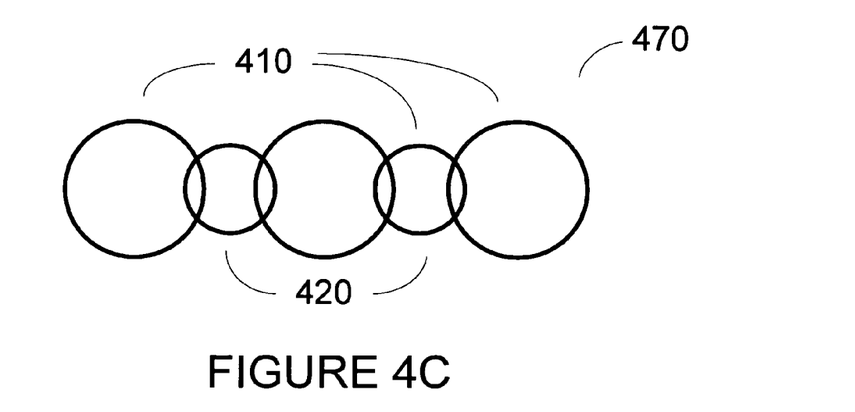
FIG. 4C is a is a schematic diagram of an overlapping linear array of coils.

Adjacent coils in the linear coil arrays may be provided in a close proximity to each other, as shown in FIGS. 4A and 4B, and/or they may overlap slightly as shown in the linear coil array 470 in FIG. 4C. The amount of overlap between adjacent coils 410, 420 may vary and can be easily determined based on the desired application. The overlap distance can be understood to represent the distance between the overlapping portion of adjacent coils as measured along a line connecting the centers of adjacent coils. This overlap distance may be between approximately 5% and 30% of the diameter of the larger adjacent coil 410, or preferably between about 10% and 25% of the diameter of the larger adjacent coil 410. The amount of overlap provided in a particular overlapping linear array of coils can be easily determined based on the desired application.

Figure 5:
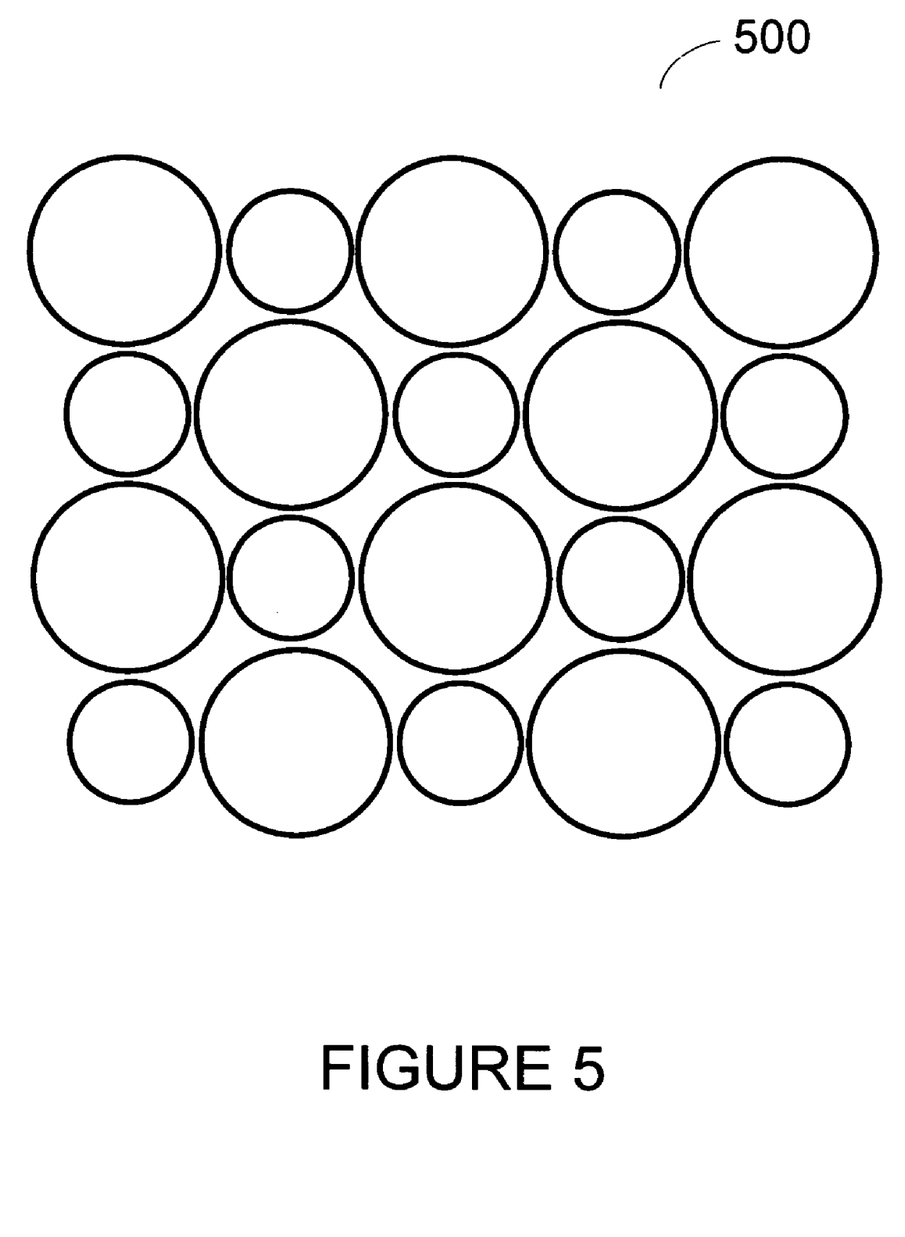
FIG. 5 is a is a schematic diagram of a two-dimensional array of coils in accordance with an exemplary embodiment of the present invention.

In still further exemplary embodiments of the present invention, several coils having at least two different sizes may be provided in a two-dimensional array or matrix. The two-dimensional matrix may be configured as two or more adjacent rows of coils, where each row may have one or more characteristics of a linear array such as those described hereinabove. For example, each row in the array may include a repeating pattern of two or more coil sizes, and/or adjacent coils within each row, and between adjacent rows, may overlap as described above. A 5×4 array 500 of non-overlapping coils is shown in FIG. 5. Other two-dimensional array configurations may also be provided in accordance with the exemplary embodiments of the present invention.

Figure 6:
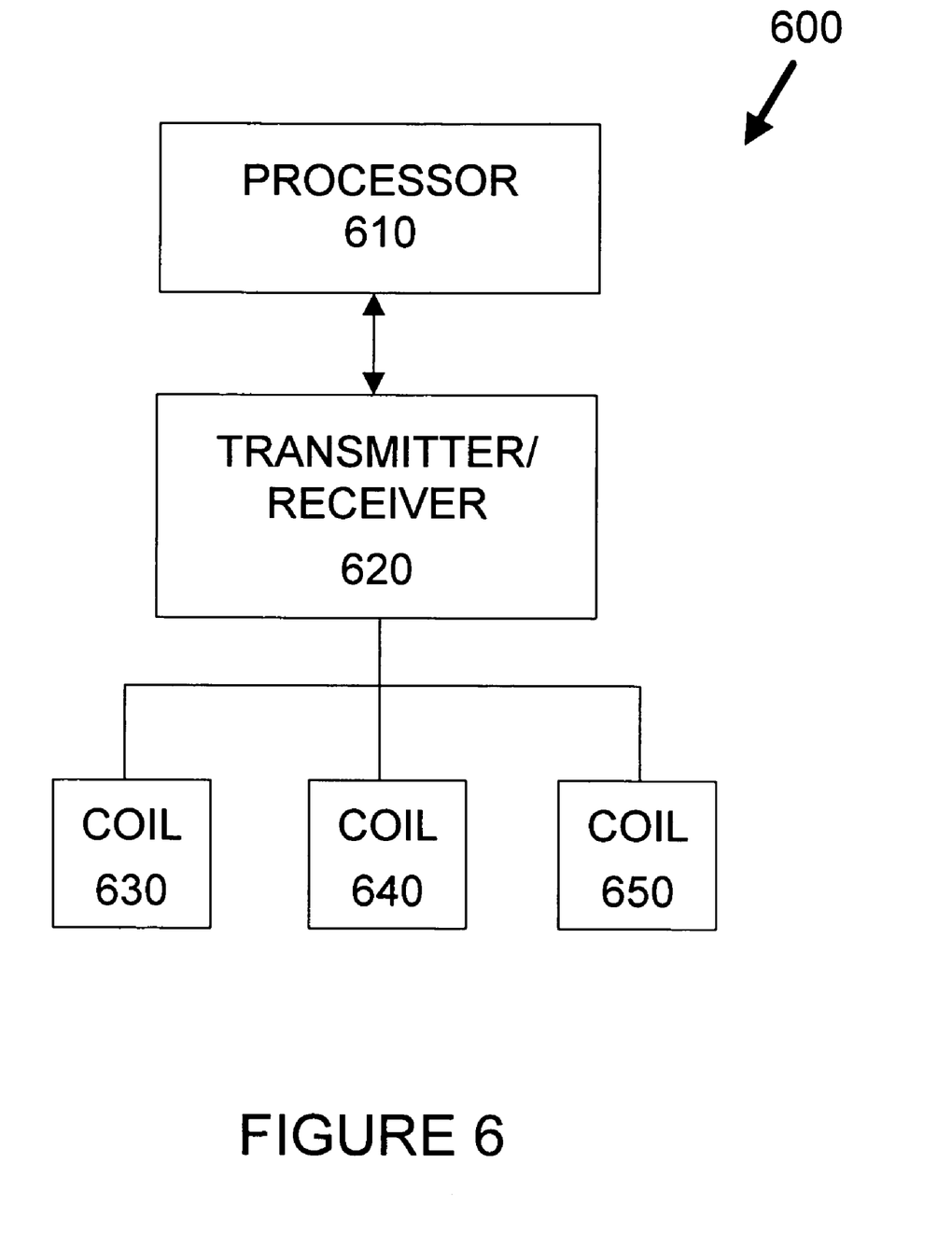
FIG. 6 is a block diagram of an MRI apparatus that uses a coil arrangement in an exemplary embodiment according to the present invention.

FIG. 6 shows a block diagram of an MRI apparatus 600 that can utilize the coil arrangement in accordance with the exemplary embodiments of the present invention. The MRI apparatus 600 can include a processing arrangement 610 that can be configured to control a transmission of RF signals toward a target patient, and which may process response NMR signals to create an MRI image. A transmitter/receiver arrangement 620 can be connected to the processor 610. In the apparatus shown in FIG. 6, the transmitter/receiver 620 is shown as a single arrangement. A separate transmitter and receiver may be used in other exemplary embodiments of the present invention. A coil arrangement that includes, e.g., three coils 630, 640, 650 can be connected to the transmitter and/or the receiver. The coils 630, 640, 650 can be used to transmit RF excitation pulses and/or to receive response NMR signals.

Figure 7:
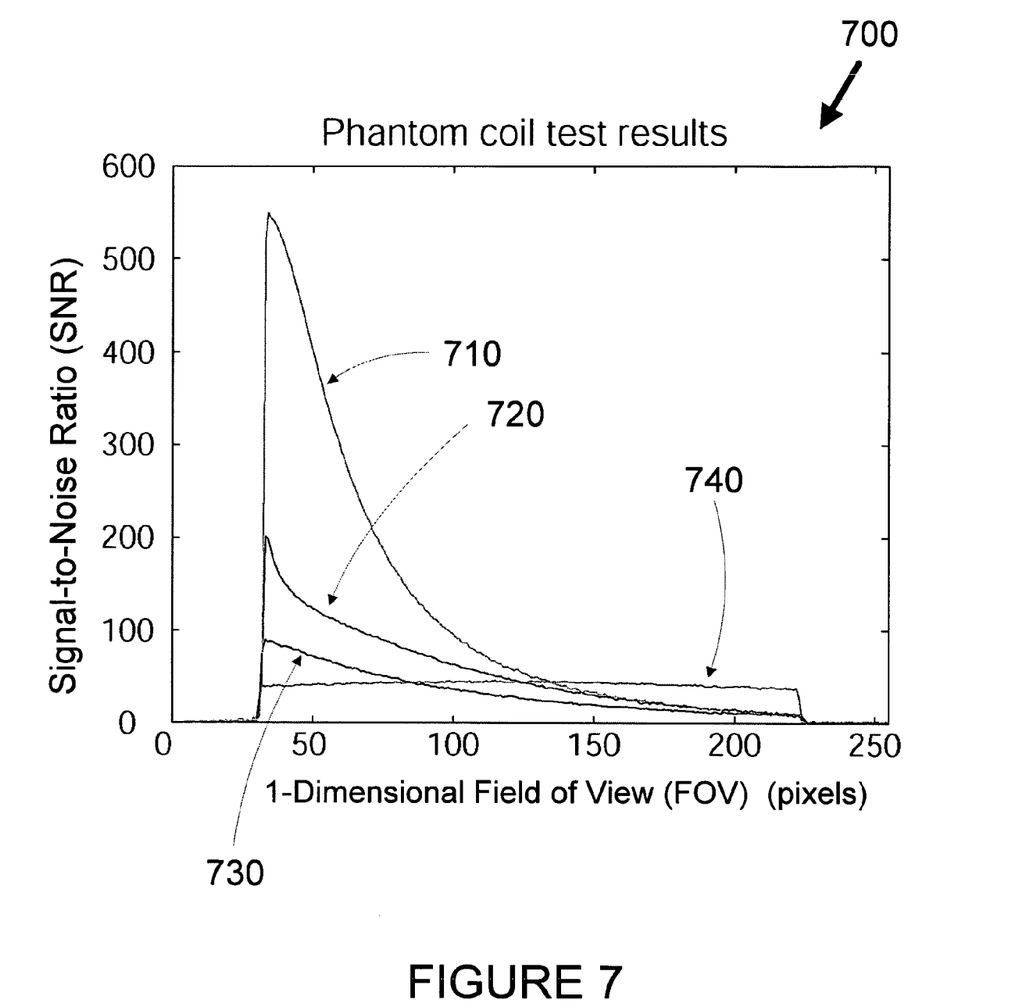
FIG. 7 is a graph of exemplary data illustrating SNR versus FOV for the coil arrangement shown in FIG. 1.

FIG. 7 shows a graph 700 of exemplary SNR verses FOV data 710 obtained using the exemplary embodiment of the coil arrangement shown in FIG. 1. Certain data shown in FIG. 7 is provided for the use of an orbital array of coils with a conventional design 720, a Siemens single large coil 730, and a Siemens CP volume coil 740. As shown in FIG. 7 for additional data 710, the "cochlear array" of coils 100 illustrated in FIG. 1 can provide a greater SNR at certain ranges of higher FOV values.

The exemplary coil arrangements in accordance with the exemplary embodiments of the present invention may be utilized for a variety of imaging applications. For example, the exemplary coil arrangements may be provided that are configured to provide image data for particular sites of anatomical interest. Particular sites may include a joint such as, e.g., a knee, a shoulder, an ankle, a wrist, or a temporomandibular joint. Alternatively, the exemplary coil arrangement may be provided that can be configured for imaging small extremities such as, e.g., fingers or toes.

The coil arrangements may also be provided for imaging the neurovascular anatomical features in the head and neck areas, including the brain and/or vascular structures. These exemplary coils may be configured to provide image data of, e.g., carotid and/or intracranial arterial circulation, including imaging of the carotid bifurcation.

The coil arrangements in accordance with the exemplary embodiments of the present invention may also be provided for imaging a torso and/or anatomical structures located therein such as, e.g., breast, heart, aorta, liver, kidney, pancreas, uterus and/or ovary in a female, and/or a prostate gland in a male.

The coil arrangements in accordance with exemplary embodiments of the present invention may also be provided for parallel MRI imaging applications, wherein scan times may be decreased significantly and/or resolution may be increased by using the coil arrangements together with parallel processing of data. They may also be utilized for interventional procedures such as, e.g., MRI-guided breast biopsies and/or other MRI-guided procedures.

The exemplary coil arrangements may also be utilized in functional MRI (fMRI) applications such as, e.g., Blood-Oxygen-Level-Dependent fMRI techniques and/or perfusion FMRI techniques for measuring cerebral blood flow. Other MRI techniques in which coil arrangements may be used include spectroscopy applications, in which an improved SNR provided by coil arrangements may result in better data. Spectroscopic techniques may be used to analyze, e.g., a brain or to help identify the presence and extent of certain diseases such as, e.g., prostate and/or liver cancer.

The coil arrangements in accordance with exemplary embodiments of the present invention may further be utilized in microscopic magnetic resonance ("MicroMR") techniques. MicroMR techniques can provide detailed imaging at small size scales and can be used, e.g., as an alternative to some histology applications. MicroMR techniques can also image microscopic areas such as, e.g., the inner cochlear fluid or a thyroid gland in detail. Such MicroMR techniques are described in, e.g., Y. Takagi et al., AJNR Am J Neuroradiol, 26:1207-1214, May 2005.

The exemplary coil arrangements may also be utilized in other magnetic resonance applications such as, e.g., magnetic resonance angiography, magnetic resonance venography, and/or stereotactic MRI techniques for providing guidance via imaging during procedures such as, e.g., a biopsy or a resection.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. For example, although the present invention is illustrated in embodiments having three circular coils or three rectangular coils, other embodiments in accordance with the present invention may use more or fewer coils and/or different coil shapes, areas and/or arrangements. For example, rectangular or oval coils may also be used. In addition, all publications referenced above are incorporated herein by reference in their entireties.

What is claimed is:

1. A coil arrangement configured to be used with a magnetic resonance imaging system, comprising at least one first coil element having a first size and at least one second coil element having a second size that is different from the first size, wherein the at least one first coil element is configured to decouple non-adjacent coil elements based on at least one of the first size or the second size, and further configured to be controlled without the use of a pre-amplifier.

2. The coil arrangement of claim 1, wherein the at least one first coil element has a first circumferential length, and wherein the at least one second coil element has a second circumferential length that is different from the first circumferential length.

3. The coil arrangement of claim 1, wherein the at least one first coil element is associated with a first interior area, and wherein the at least one second coil element is associated with a second interior area which is different from the first interior area.

4. The coil arrangement of claim 1, wherein the at least one first coil element is associated with a first radial length, and wherein the at least one second coil element is associated with a second radial length that is different from the first radial length.

5. The coil arrangement of claim 1, wherein the at least one first coil element is positioned adjacent to the at least one second coil element such that a portion of the at least one first coil element overlaps a portion of the at least one second coil element.

6. The coil arrangement of claim 1, wherein the first and second element have different shapes.

7. The coil arrangement of claim 1, further comprising at least one third coil element located adjacent to at least one of the at least one first coil element and the at least one second coil element.

8. The coil arrangement of claim 7, wherein at least one portion of the at least one second coil element overlaps at least a portion of the at least one third coil element.

9. The coil arrangement of claim 7, wherein the at least one second coil element is smaller than at least one of the at least one first coil element or the at least one third coil element.

10. The coil arrangement of claim 9, wherein the at least one first coil element and the at least one third coil element have approximately the same size.

11. The coil arrangement of claim 7, wherein the at least one second coil element is larger than at least one of the at least one first coil element or the at least one third coil element.

12. The coil arrangement of claim 1, wherein the at least one first coil element is provided along a plane which is approximately parallel to a plane along which the at least one second coil element extends.

13. The coil arrangement of claim 1, wherein the at least one first coil element includes at least two first coil elements, and wherein the coil elements are configured in a linear array.

14. The coil arrangement of claim 13, wherein a center of each of the first and second coil elements is provided along a straight line.

15. The coil arrangement of claim 14, wherein each of the first and second coil elements is configured to overlap at least partially with at least one adjacent one of the first or second coil elements.

16. The coil arrangement of claim 13, wherein the center of each of the first and second coil elements is provided along a curved line.

17. The coil arrangement of claim 16, wherein each of the first and second coil elements is configured to overlap at least partially with at least one adjacent one of the first or second coil elements.

18. The coil arrangement of claim 1, wherein the at least one first coil element includes at least two first coil elements, and wherein the at least one second coil element includes at least two second coil elements, and wherein the coil elements are configured in a two-dimensional array.

19. The coil arrangement of claim 18, wherein a size of each of the first and second coil elements is different from a size of at least one adjacent one of the first or second coil elements in the array.

20. The coil arrangement of claim 19, wherein each of the first and second coil elements is configured to overlap at least partially with at least one adjacent one of the first or second coil elements.

21. The coil arrangement of claim 1, wherein at least one of the at least one first coil element or the at least one second coil element is connected to a balun.

22. The coil arrangement of claim 1, wherein the at least one first coil element is provided adjacent to the at least one second coil element.

23. A coil arrangement configured to be used with a magnetic resonance imaging system, comprising:
   at least one first coil element having a first radial length; and
   at least one second coil element having a second radial length, wherein the second radial length is different from the first radial length;
   wherein the at least one first coil element is configured to decouple non-adjacent coil elements based on at least one of the first radial length or the second radial length, and further configured to be controlled without the use of a pre-amplifier.

24. A magnetic resonance imaging apparatus, comprising:
   a coil arrangement comprising at least one first coil element having a first size, and at least one second coil element having a second size that is different from the first size, and wherein the at least one second coil element is positioned adjacent to the at least one first coil element; and
   a processor configured to receive signals provided by the coil arrangement in response to an excitation pulse; wherein the at least one first coil element is configured to decouple non-adjacent coil elements based on at least one of the first size or the second size, and further configured to be controlled without the use of a pre-amplifier.

25. The apparatus of claim 24, wherein the at least one first coil element includes at least two first coil elements.

26. A coil arrangement configured to be used with a magnetic resonance imaging system, comprising at least one first coil element having a first size and at least one second coil element having a second size that is different from the first size, the at least one first coil element being provided adjacent to the at least one second coil element, wherein the at least one first coil element is configured to decouple non-adjacent coil elements based on at least one of the first size or the second size.

* * * * *